United States Patent
Fang et al.

(10) Patent No.: US 9,859,124 B2
(45) Date of Patent: Jan. 2, 2018

(54) METHOD OF MANUFACTURING SEMICONDUCTOR DEVICE WITH RECESS

(71) Applicant: TAIWAN SEMICONDUCTOR MANUFACTURING COMPANY LTD., Hsinchu (TW)

(72) Inventors: Li-Yen Fang, Tainan (TW); Jung-Chih Tsao, Tainan (TW); Yao-Hsiang Liang, Hsinchu (TW); Yu-Ku Lin, Tainan (TW)

(73) Assignee: TAIWAN SEMICONDUCTOR MANUFACTURING COMPANY LTD, Hsinchu (TW)

( * ) Notice: Subject to any disclaimer, the term of this patent is extended or adjusted under 35 U.S.C. 154(b) by 0 days.

(21) Appl. No.: 14/690,051

(22) Filed: Apr. 17, 2015

(65) Prior Publication Data

US 2016/0307761 A1    Oct. 20, 2016

(51) Int. Cl.
| | | |
|---|---|---|
| *H01L 21/44* | (2006.01) | |
| *H01L 21/47* | (2006.01) | |
| *H01L 21/46* | (2006.01) | |
| *H01L 21/31* | (2006.01) | |
| *H01L 21/288* | (2006.01) | |
| *H01L 21/768* | (2006.01) | |
| *C25D 7/12* | (2006.01) | |
| *C25D 3/38* | (2006.01) | |
| *C25D 5/34* | (2006.01) | |

(52) U.S. Cl.
CPC ......... *H01L 21/2885* (2013.01); *C25D 3/38* (2013.01); *C25D 5/34* (2013.01); *C25D 7/123* (2013.01); *H01L 21/76861* (2013.01); *H01L 21/76873* (2013.01)

(58) Field of Classification Search
CPC .......... H01L 21/02; H01L 21/28; H01L 21/70
USPC ........ 438/654, 780, 640, 653, 687; 257/762, 257/774, E21.175, E21.305, E21.597, 257/E23.166
See application file for complete search history.

(56) References Cited

U.S. PATENT DOCUMENTS

| | | | |
|---|---|---|---|
| 6,211,071 B1 | 4/2001 | Lukanc et al. | |
| 6,284,121 B1* | 9/2001 | Reid ..................... | C25D 3/38 204/242 |
| 6,315,883 B1* | 11/2001 | Mayer ................... | B23H 5/08 205/123 |
| 6,344,410 B1* | 2/2002 | Lopatin ................ | H01L 21/288 257/E21.174 |

(Continued)

OTHER PUBLICATIONS

Office Action and search report issued by the Taiwan Intellectual Property Office dated Aug. 2, 2016 for corresponding Taiwan application 104137683.

*Primary Examiner* — Sheikh Maruf
(74) *Attorney, Agent, or Firm* — WPAT, P.C., Intellectual Property Attorneys; Anthony King

(57) ABSTRACT

The present disclosure provides a method of manufacturing a semiconductor device. The method includes providing a substrate with a dielectric disposed thereon, wherein the dielectric has a recess formed by a plurality of exposed surfaces; forming a conductive film on the plurality of exposed surfaces; applying a surface agent to the recess so that the surface agent adheres to a portion of the conductive film; immersing the substrate into an electroplating solution comprising metallic ions; and applying a bias to the conductive film in order to fill metallic material in the recess.

20 Claims, 11 Drawing Sheets

(56) References Cited

U.S. PATENT DOCUMENTS

| | | | |
|---|---|---|---|
| 6,346,479 B1* | 2/2002 | Woo | H01L 21/76877 257/E21.175 |
| 6,355,153 B1* | 3/2002 | Uzoh | C25D 5/02 205/640 |
| 6,436,816 B1* | 8/2002 | Lee | C23C 18/36 257/E21.174 |
| 6,709,565 B2* | 3/2004 | Mayer | B23H 5/08 205/640 |
| 6,743,473 B1* | 6/2004 | Parkhe | C23C 16/18 257/E21.168 |
| 6,867,136 B2* | 3/2005 | Basol | B23H 5/08 257/E21.175 |
| 7,341,946 B2* | 3/2008 | Kailasam | C25D 7/12 257/E21.175 |
| 8,828,863 B1* | 9/2014 | Lee | H01L 21/76865 257/E21.586 |
| 2001/0015321 A1* | 8/2001 | Reid | C25D 3/38 205/103 |
| 2002/0074238 A1* | 6/2002 | Mayer | B23H 5/08 205/660 |
| 2003/0075808 A1* | 4/2003 | Inoue | C23C 18/1608 257/774 |
| 2003/0181040 A1* | 9/2003 | Ivanov | C23C 18/1628 438/687 |
| 2004/0072419 A1* | 4/2004 | Baskaran | C25D 3/38 438/627 |
| 2004/0096592 A1* | 5/2004 | Chebiam | C23C 18/34 427/443.1 |
| 2005/0124154 A1* | 6/2005 | Park | H01L 21/28562 438/643 |
| 2005/0277298 A1* | 12/2005 | Lin | H01L 21/76831 438/687 |
| 2005/0279641 A1* | 12/2005 | Basol | C25D 5/022 205/134 |
| 2005/0282371 A1* | 12/2005 | Patton | C25D 3/38 438/597 |
| 2007/0202676 A1* | 8/2007 | Yeh | H01L 21/02063 438/597 |
| 2007/0267754 A1* | 11/2007 | Kirby | H01L 21/76868 257/774 |
| 2009/0277867 A1* | 11/2009 | Mayer | B23H 5/08 216/13 |
| 2012/0315756 A1* | 12/2012 | Weidman | C23C 18/1608 438/653 |
| 2015/0255334 A1* | 9/2015 | Yang | H01L 21/76879 438/654 |

* cited by examiner

METHOD OF MANUFACTURING SEMICONDUCTOR DEVICE WITH RECESS

BACKGROUND

To achieve faster operating speeds, integrated circuits (ICs) are being developed with smaller feature sizes and higher densities of components. Conductivity of metal interconnections has emerged as a limitation in the development of these high performance devices. Forming electrically conducting vias, contacts, and conductors of copper or other metals becomes increasingly challenging as feature sizes are reduced. Techniques for forming such metal features include physical vapor deposition (PVD), chemical vapor deposition (CVD), plasma enhanced chemical vapor deposition (PECVD) and electrochemical deposition (also referred to as electroplating or electrodeposition.)

The conventional electroplating process includes steps as described in the following. The wafer is first immersed in an electrolytic bath containing metallic ions and is biased as the cathode in an electric circuit. With the solution positively biased, the metallic ions become current carriers which flow towards and are deposited on the exposed surfaces of the wafer. As the designed feature sizes become smaller and smaller, there are several obstacles which need to be overcome for the formation of small embedded damascene metal features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
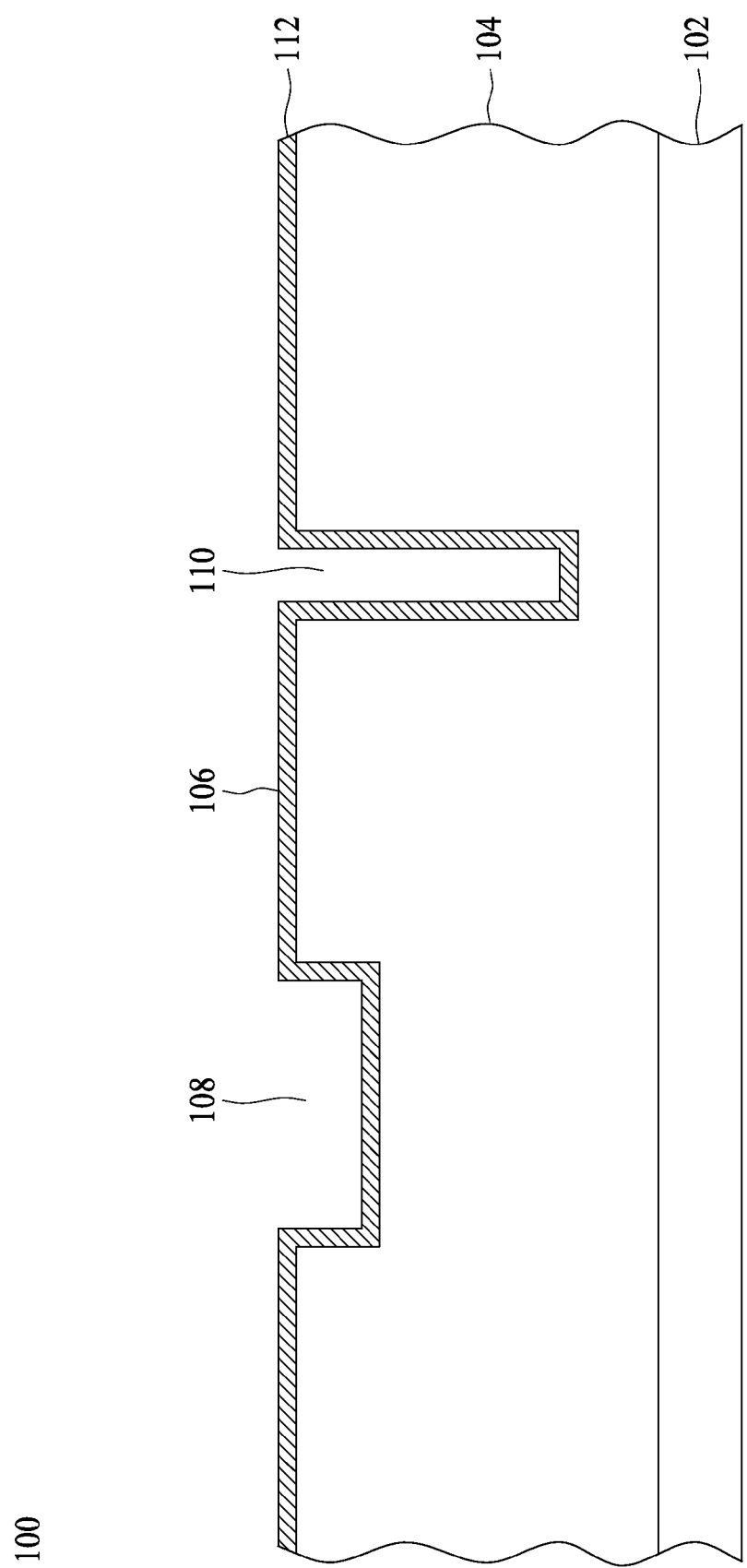
FIG. 1 is diagram illustrating a cross-sectional view of a patterned multilayer wafer on which metal is to be electroplated.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Manufacturing of semiconductor devices commonly requires deposition of electrically conductive material on semiconductor wafers. The conductive material, such as copper, is often deposited by electroplating onto a seed layer of copper deposited onto the wafer surface by a physical vapor deposition (PVD) or chemical vapor deposition (CVD) method. Electroplating is a method of choice for filling metal into the vias and trenches of the processed wafer during damascene and dual damascene operation.

Damascene operation is widely used for forming interconnections on integrated circuits (ICs). Damascene operation involves formation of inlaid metal lines in trenches and vias formed in a dielectric layer (inter-metal dielectric). In a typical damascene operation, a pattern of trenches and vias is etched in the dielectric layer of a semiconductor wafer substrate. A thin layer of diffusion-barrier film such as tantalum, tantalum nitride, or a TaN/Ta bi-layer is then deposited onto the wafer surface by a PVD method, followed by deposition of seed layer of copper on top of the diffusion-barrier layer. Typical materials for diffusion barrier layers include titanium (Ti), tantalum (Ta), tantalum nitride (TaN), tantalum nitride silicon (TaNSi), tungsten (W), titanium nitride (TiN), titanium nitride silicon (TiNSi) and the like.

The trenches and vias are filled with copper most commonly by using an electroplating operation. Because electroplating must occur on a conductive layer, a copper seed layer is first deposited on the diffusion barrier layer with CVD or PVD methods. CVD methods can deposit a conformal copper seed layer with good adhesion, but CVD methods are expensive as compared to PVD operations. PVD methods can deposit a copper seed layer with good adhesion, but produces a less conformal film that poorly covers the sidewalls and bottom surfaces of trenches. A thicker PVD seed layer is therefore generally considered necessary to ensure that an electrically conductive layer is provided for subsequent electroplating. The thicker PVD seed layer increases aspect ratios in features and makes the features harder to fill with an electroplating operation.

One challenge facing damascene operation is the difficulty of initiating the growth of the metal film within recessed features, particular recessed features with high depth-to-width aspect ratios, without forming voids or seams. Further, in typical PVD and some CVD processes, metal may preferentially deposit near the top of recessed features leading to a "bottleneck" shape. Further plating of metal onto the bottleneck may result in sealing the top of the feature before completely filling the feature with metal, creating a void. Voids increase the resistance of the conductor over its designed value due to the absence of a planned-for conductor. Also, trapped electrolytes in sealed voids may corrode the metal. This may lead to degraded device performance or device failure in extreme cases.

The present disclosure provides several embodiments to illustrate an enhanced method of facilitating an electroplating operation. The surface condition which the metal ions encounter during electroplating is adjusted in order to enhance filling capability, especially for devices featuring large aspect ratio trenches or vias. In some embodiments, a surface agent is applied on the seed layer prior to the electroplating operation so as to change the surface condition. The surface agent may be coated on the seed layer in various ways, such as coating, or pasting, etc. With the surface agent coated on the seed layer, a bottom-up and void-free gap filling electroplating operation is provided for nano-scale semiconductor devices.

FIG. 1 is a diagram illustrating a cross-sectional view of a patterned multilayer wafer 100, on which metal is to be electroplated. The multilayer wafer 100 includes a semiconductor substrate 102 and a dielectric material 104. The surface of the wafer 100 includes a flat field region 106 and features, such as trenches or vias with a range of aspect ratios defined as the ratio of depth to width. For example, a small depth-to-width aspect ratio feature 108 and a large depth-to-width aspect ratio feature 110 are included in the surface of the multilayer wafer 100. In the present disclosure, the large depth-to-width aspect ratio may refer to a depth-to-width aspect ratio greater than about 5; however, this is not a limitation of the disclosure.

A seed layer 112, typically deposited by a PVD or CVD process as mentioned above overlies the surface of the wafer 100. The seed layer may be non-uniform and may exhibit islands. As such, the seed layer may not completely cover the surface of all the features of the wafer 100.

The patterned multilayered wafer 100, covered by a seed layer 112 of the metal to be electroplated, is immersed into an electroplating bath as the electroplating begins. The electroplating bath contains specified additives together with controlled current density. Typical electroplating baths contain positive ions of the metal to be plated and the associated anions in an acid solution. For example, copper electroplating is typically performed from a solution of CuSO4 dissolved in an aqueous solution of sulfuric acid. In addition, the electroplating bath contains ppm levels of chloride ions and several additives, classified as accelerators, suppressors, and levelers. However, this is not a limitation of the disclosure.

The electroplating operation employs an accelerator additive in a plating solution so as to accelerate through a bottom-up operation. In addition to the accelerator additive, a suppressor additive may also be employed to block the metal surface in order to prevent a void from being formed. As the name implies, accelerators or the accelerator additive are additives which increase the rate of the plating reaction. Accelerators are molecules which adsorb on copper surfaces and increase the local current density at a given applied voltage. Accelerators typically contain pendant sulfur atoms, which are understood to participate in the cupric ion reduction reaction and thus strongly influence the nucleation and surface growth of copper films. Accelerator additives are most commonly derivatives of mercaptopropanesulfonic acid (MPS) or dimercaptopropanesulfonic acid (DPS.) With the existence of accelerators, the entire duration of the electroplating operation or damascene operation may be shortened. In this way, time costs can be significantly saved and the entire semiconductor production can be more cost-effective.

As mentioned above, accelerators are employed along with suppressors in order to mitigate side effects. For example, using accelerators solely may cause more difficulty in filling trenches and other small features with copper without any voids. Suppressors are added to plating solutions at relatively high concentrations and form uniform adsorbed films at the copper surface that are not strongly dependent on local mass transfer effects. Suppressors are derived from polyethylene glycol (PEG), polypropylene glycol (PPG), polyethylene oxide, or their derivatives or co-polymers. Suppressors are polymers which absorb at a copper surface and decrease the local current density at a given applied voltage, thus retarding plating at locations particularly near the top of recessed features. In this way, the electroplating may take place preferentially at the bottom of recessed features, which then reduces the chance of creating voids. The operation is known as a bottom-up operation.

Figure 2:
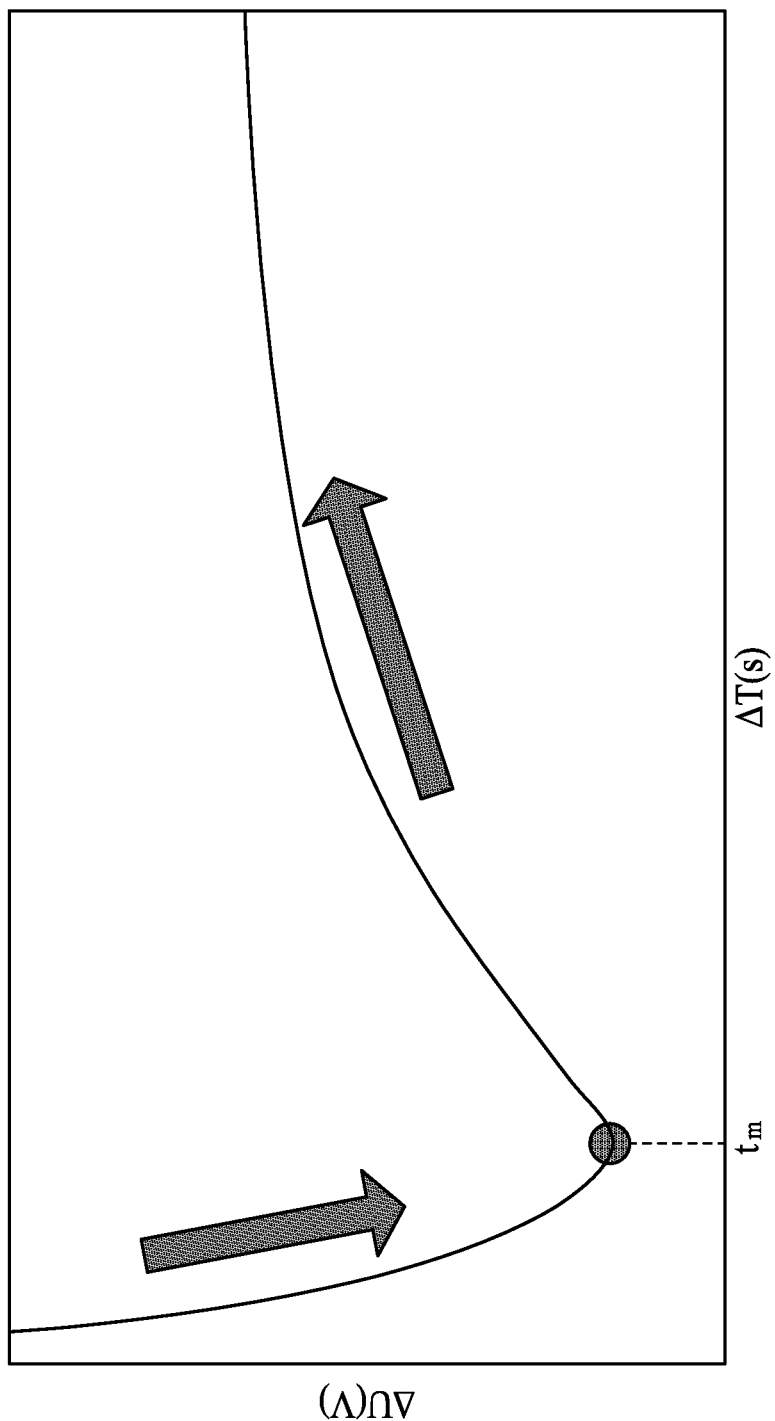
FIG. 2 is an electrochemical transient diagram illustrating suppresser/accelerator interaction upon a patterned multilayer wafer.

FIG. 2 is an electrochemical transient diagram illustrating suppresser/accelerator interaction upon the patterned multilayer wafer 100. A Y axis of the diagram is representative of measured electrical potential on the metal seed layer 112, denoted as $\Delta U(V)$; an X axis of the diagram is representative of time denoted as $\Delta T(s)$.

At a first phase before time $t_M$, it can be seen that the electrical potential of the metal seed layer 112 starts to descend when the wafer 100 is immersed into the electroplating bath containing a suppressor additive. The curve reaches to its lowest point at time $t_M$, where suppressers form a maximum polymer film adhering to the surface of the metal seed layer 112. The polymer film insulates the surface of the metal seed layer 112. The polymer film comprised of a hydrophilic polymer, such as large size polyethylene glycol, can temperately retard accelerators in order to reach to the surface of the metal seed layer 112. Since the size of accelerators is much smaller than the polyethylene glycol, accelerators can finally pass through the polymer film and the measured electrical potential starts rising at a second phase after time $t_M$. In other words, the polymer film is gradually deactivated by accelerators.

Figure 3:
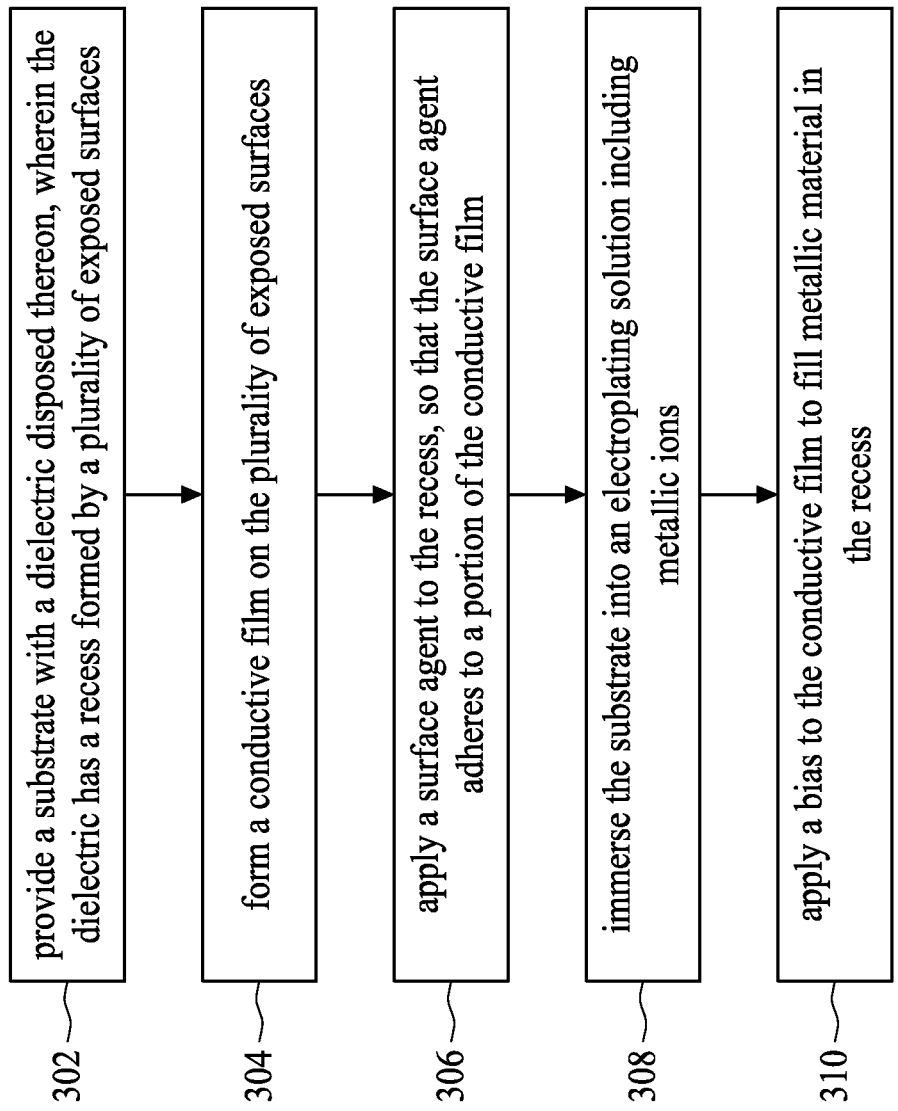
FIG. 3 is a flowchart illustrating a method of manufacturing a semiconductor device performed upon the multilayered wafer of FIG. 1 according to an exemplary embodiment of the disclosure.

FIG. 3 is a flowchart illustrating a method of manufacturing a semiconductor device performed upon the multilayered wafer 100 of FIG. 1 according to an exemplary embodiment of the disclosure. The patterned multilayer wafer 100 is prepared in step 302. Specifically, the substrate 102 may be a bulk silicon substrate. Alternatively, the substrate 102 may be comprised of an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods. The dielectric 104, also known as an insulator layer, may be comprised of any suitable material, including silicon oxide, sapphire, other suitable insulating materials, and/or combinations thereof. An exemplary insulator layer may be a buried oxide layer (BOX). The insulator is formed by any suitable operation, such as implantation (e.g., SIMOX), oxidation, deposition, and/or other suitable operations.

The recess 110 with a large depth-to-width aspect ratio and the recess 108 with a small depth-to-width aspect ratio are formed by a plurality of exposed surfaces. For example, the recess 108 or the recess 110 is formed by side wall surfaces and a bottom surface. However, this is not a limitation of the present disclosure. The recess 108 or the recess 110 may alternatively have more complicated shapes. As mentioned above, the seed layer 112, which refers to a conductive film, is comprised of the metal to be electroplated. The seed layer 112 is formed on a surface of the dielectric material 104 according to step 304. In some embodiments, the seed layer 112 may completely cover the front surface of the dielectric material 104. However, this is not a limitation. In some embodiments, the seed layer 112 may cover a portion of the front surface of the dielectric material 104. In some embodiment, the flat field region 106 and the exposed surfaces of the recesses 108 and 110 are completely covered by the seed layer 112.

Step 306 is arranged after the seed layer formation. A term called "pretreatment" may be used for referring to the operation of step 306. It also implies that step 306 is a treatment intentionally performed on the wafer 100 before the electroplating operation. That is, in addition to the electroplating operation, a further pretreatment is conducted before the electroplating operation so as to gain some advantage or to improve the following operations. In the present disclosure, the pretreatment can be briefly summarized as an operation to build up suppression ability on the surface of the seed layer 112 of the wafer 100 before accelerators may have a chance to intervene. In this way, the top or side wall of the recessed features 108 and 110 can be ensured in order to possess the suppression ability before contacting with the electroplating solution.

The pretreatment operation includes applying a surface agent to the seed layer 112. The surface agent may be applied to the flat field region 106 and the recesses 108 and 110. In some embodiments, the surface agent may be applied to a portion of the conductive film of the recesses 108 and 110. In this way, the surface agent may merely adhere to a portion of the conductive film of the recesses 108 and 110. However, this is not a limitation of the disclosure. The surface agent with a suppression ability substantially retards the metallic ions being attached onto the conducting film in the subsequent electroplating step. In some embodiments, the surface agent may include a hydrophilic polymer. In some embodiments, the hydrophilic polymer may be polyethylene glycol (PEG). In some embodiments, the hydrophilic polymer may be polypropylene glycol (PPG). In some embodiments, the hydrophilic polymer may be polyethylene oxide (PEO). However, this is not a limitation of the disclosure. In practice, any other polymer or material which is appropriate for retarding the implanting of the specified type of metallic ion may also be adopted by the pretreatment method. The suppressor polymer of the surface agent may be the same as the suppressor polymer of the suppressor additive in the electroplating solution used by the following electroplating operation. In some embodiments, the suppressor polymer of the surface agent may be different from the suppressor polymer of the suppressor additive in the electroplating solution used by the following electroplating operation.

Figure 4:
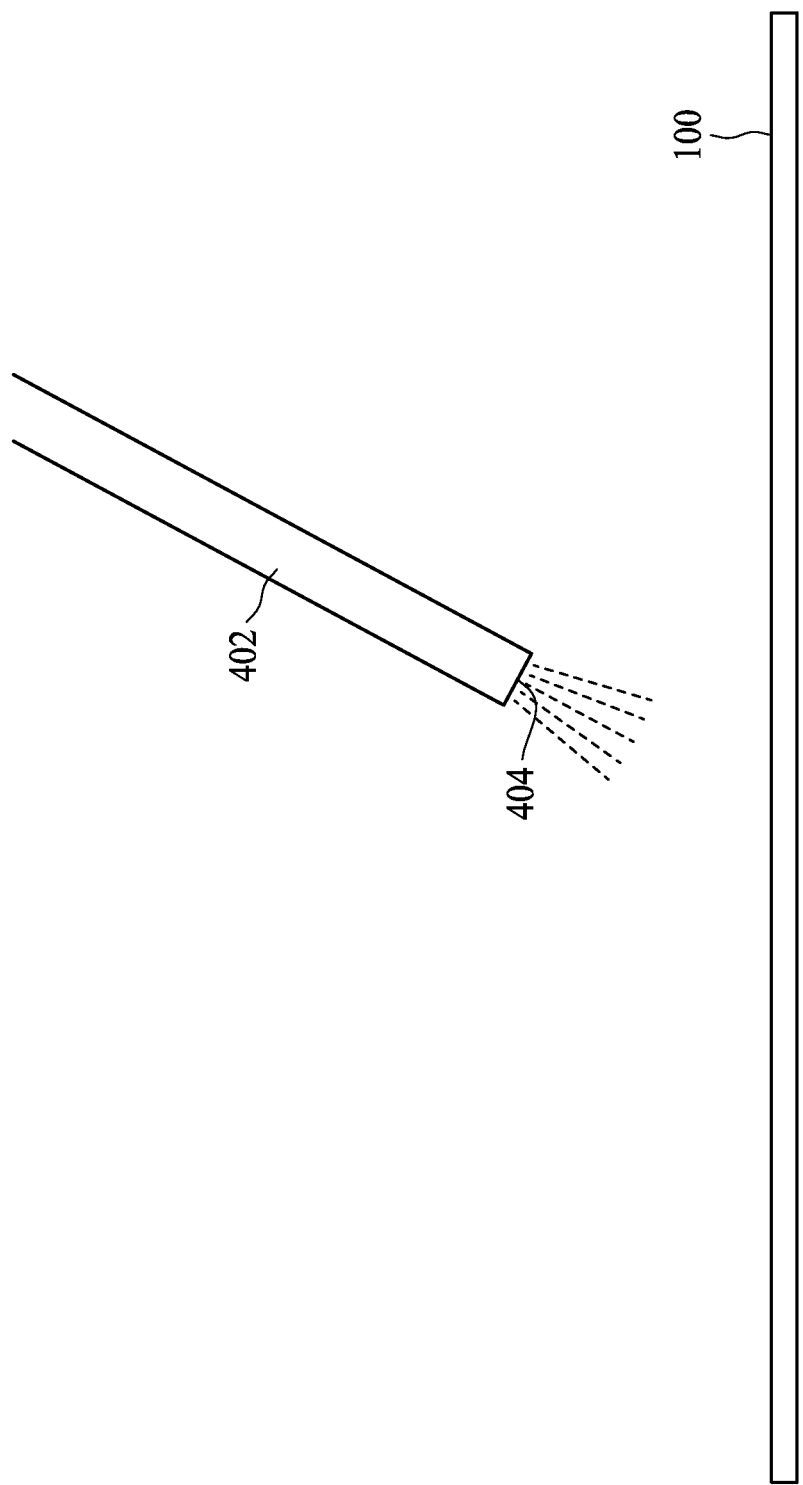
FIG. 4 is a cross-sectional view illustrating a spray coating operation performed upon the multilayer wafer of FIG. 1.
Figure 5:
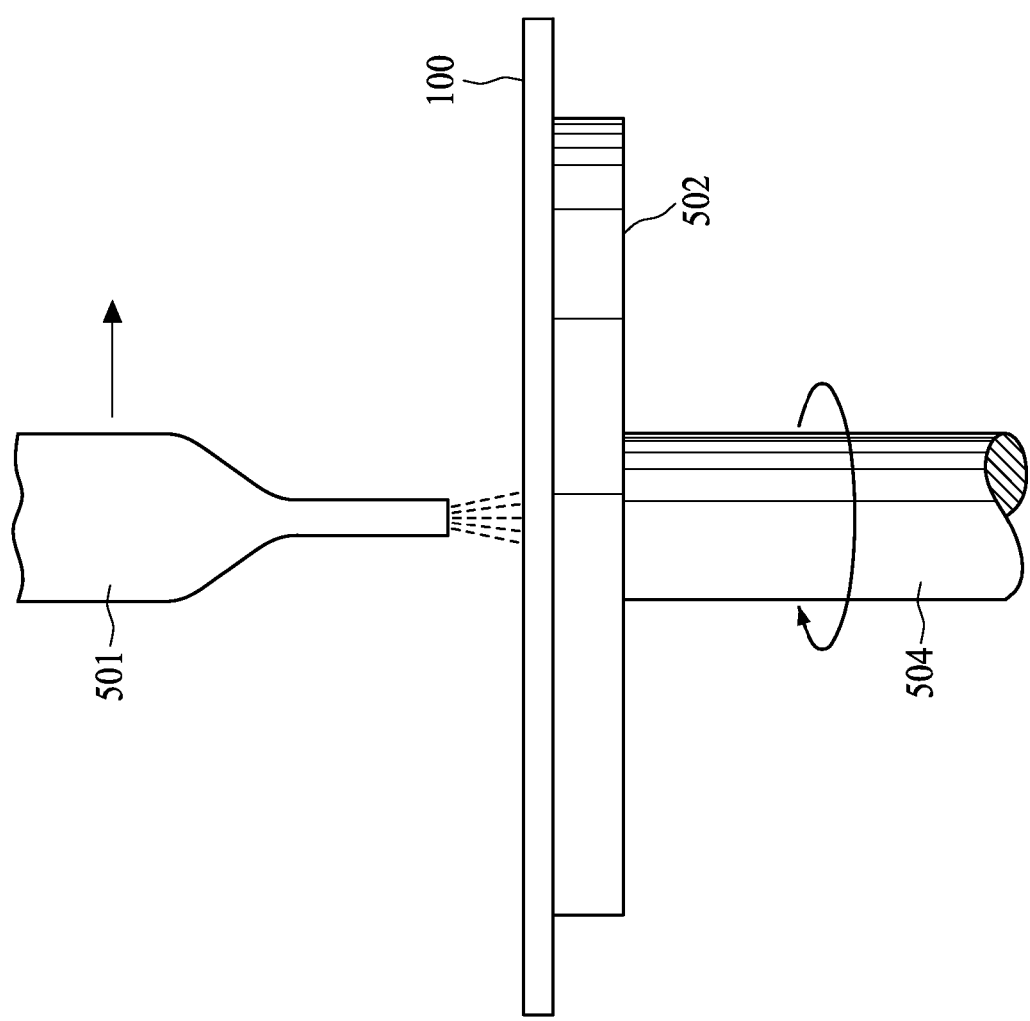
FIG. 5 is a cross-sectional view illustrating a spin coating operation performed upon the multilayer wafer of FIG. 1.

The surface agent may be applied to the flat field region 106 and the recesses 108 and 110 by way of spray coating. FIG. 4 is a cross-sectional view illustrating a spray coating operation performed upon the multilayer wafer 100 shown in FIG. 1. A tubular part 402 has an outlet nozzle 404. The outlet nozzle 404 may be controlled to a certain position of the multilayer wafer 100 and then sprays the suppressor agent on the wafer 100. In some embodiments, the spray coating operation may be a thermal spray coating operation. In some embodiments, the surface agent may be applied to the flat field region 106 and the recesses 108 and 110 by means of spin coating. Spin coating is a procedure used to dispose uniform thin films to flat substrates. FIG. 5 is a cross-sectional view illustrating a spin coating operation performed upon the multilayer wafer 100 shown in FIG. 1. The operation begins by applying a small amount of the suppressor agent on the center or edge of the multilayer wafer 100 through a nozzle 501 positioned above the center of the wafer 100, which is either spinning at low speed or not spinning at all. A turntable 502, which carries the wafer 100, then rotates at a high speed around its shaft 504 in order to spread the coating material, i.e. the suppressor agent, by centrifugal force. Rotation is continued while the fluid spins off the edges of the multilayer wafer 100, until the desired thickness of the film is achieved. The applied solvent is usually volatile, and simultaneously evaporates. Therefore, the higher the angular speed of spinning, the thinner the film. The thickness of the film also depends on the viscosity and concentration of the solution and the solvent.

Figure 6:
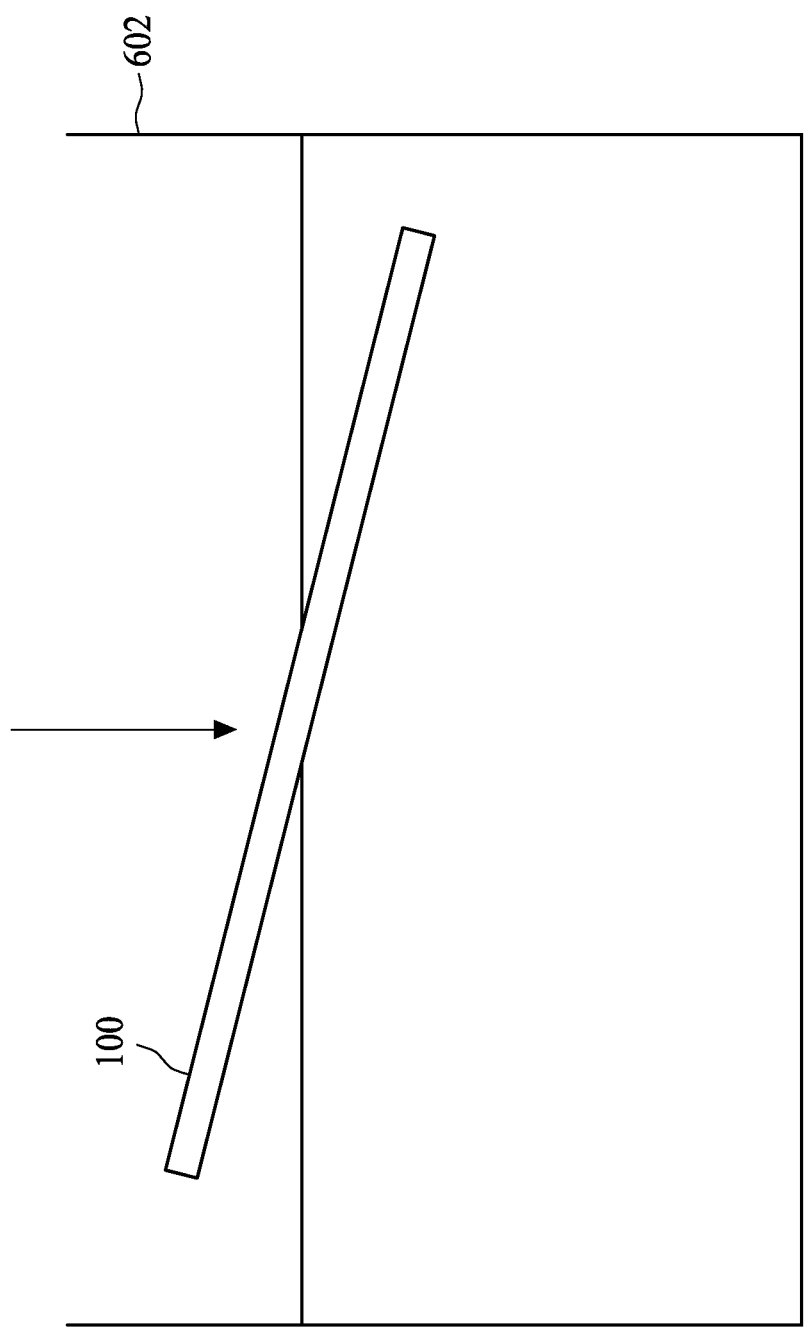
FIG. 6 is a cross-sectional view illustrating a wetting operation performed upon the multilayer wafer of FIG. 1.
Figure 7:
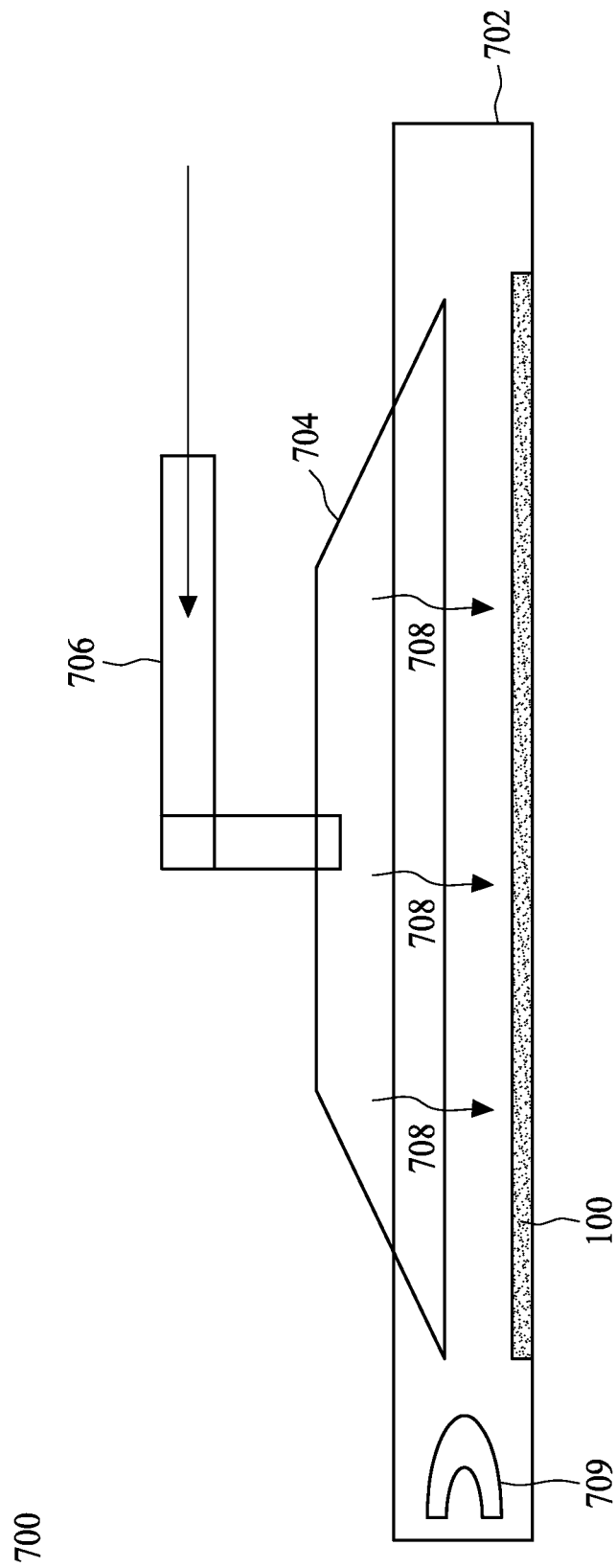
FIG. 7 is a cross-sectional view illustrating a vapor coating operation performed upon the multilayer wafer of FIG. 1.

In some embodiments, the surface agent may be applied to the flat field region 106 and the recesses 108 and 110 through a wetting operation. FIG. 6 is a cross-sectional view illustrating a wetting operation performed upon the multilayer wafer 100 shown in FIG. 1. As shown in FIG. 6, the wafer 100 is immersed into a tank 602 filled with the suppressor agent. In some embodiment, the wafer 100 may be controlled to have a tilt angle during the wetting operation. The wafer 100 may be remained and immersed for a predefined time period in the tank 602. In some embodiments, the surface agent may be applied to the flat field region 106 and the recesses 108 and 110 through a vapor coating operation. FIG. 7 is a cross-sectional view illustrating a vapor coating operation performed upon the multilayer wafer 100 shown in FIG. 1. The vapor coating device 700 atomizes a conformal coating fluid, such as the suppressor agent solution, over the multilayer wafer 100 that is to be coated. The spray device 700 includes a process chamber 702, a spray head 704, a fluid line 706 and a heating device 709. The spray head 704 receives the suppressor agent to be vaporized via the fluid line 706. The fluid line receives the transmitted suppressor agent from a holding tank (not shown). The spray head 704 vaporizes the suppressor agent, and sprays/emits the vaporized suppressor agent 708 toward the wafer 100 in order to form a thin film layer on the wafer 100.

After the patterned multilayer wafer 100 has been coated by a thin polymer layer 114, either by the vapor coating operation or the alternate technique, the wafer 500 may be cooled and the coated polymer layer 114 is cured. "Cured" in this sense means that the coated polymer layer 114 is solidified and hardened. The particular method employed will depend on the polymer. However, this is not a limitation of the disclosure.

In practice, when applying the surface agent during the pretreatment operation, the suppressor polymer may not be uniformly distributed across the seed layer 112; it is especially difficult to realize a uniform coating around the recessed features. For those recessed features with a high depth-to-width aspect ratio, for example, it is more possible for the surface agent to reach and adhere to places near the top of the recessed features rather than reaching to the bottom area. As mentioned in the preceding descriptions, the recessed features may present a "bottleneck" shape. The "bottleneck" shape makes it more difficult to apply the surface agent uniformly to every surface in the deep recesses. In other words, a lowest density of the surface agent adhering to the conductive film of the recesses occurs preferentially on the bottom surfaces of the recesses having the largest depth-to-width aspect ratio. For example, the recessed feature 110 has a lower surface agent density on its bottom surface as compared with other surfaces of the flat field region 106 or the recess 108 since the high aspect ratio makes the suppressor polymer easily touch down on the side wall instead of the bottom surface. Statistically, a recess bottom may have a surface agent density dependent on its depth-to-width aspect ratio. In more specific terms, the surface agent density of a bottom may decrease as its depth-to-width aspect ratio increases.

Figure 8:
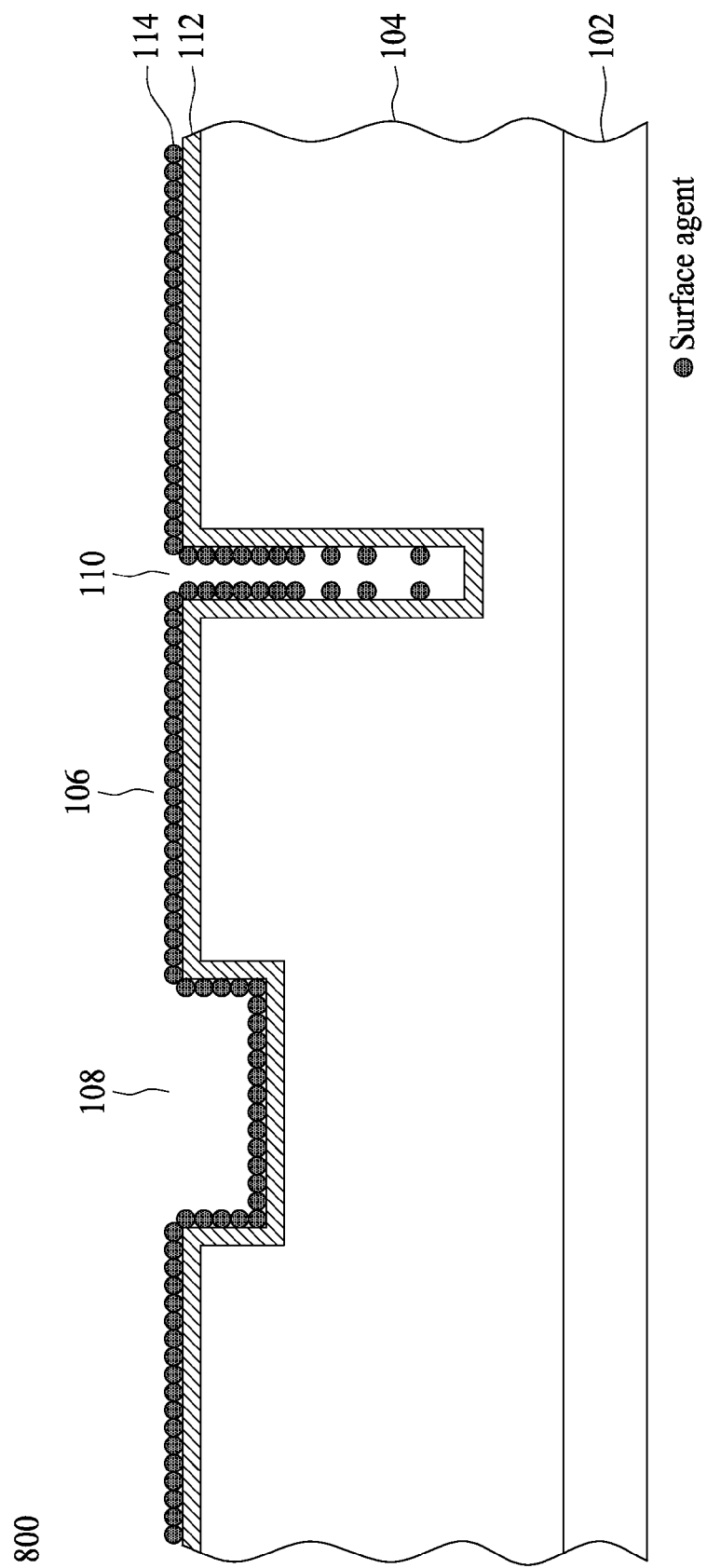
FIG. 8 is a diagram illustrating a cross-sectional view of a patterned multilayer wafer covered by a surface agent.

FIG. 8 is a diagram illustrating a cross-sectional view of the patterned multilayer wafer 100 covered by a surface agent. The patterned multilayer wafer 800 is obtained by applying the surface agent to the patterned multilayer wafer 100 shown in FIG. 1. As discussed earlier, the surface agent including a suppressor polymer, such as PEG, PPG or PEO, tends to adhere to places near the top surface of the conductive seed layer 112 instead of the bottom surfaces of the recessed features far away from the surface. The surface agent forms a thin polymer layer 114 on the conductive seed layer 112. The thin polymer layer 114 can be regarded as being formed by a plurality of large suppressor polymers arranged on the conductive seed layer 112 in a non-uniform manner. Since there are intervals between the large suppressor polymers, the conductive seed layer 112 is not completely insulated by the thin polymer layer 114. As can be seen from FIG. 8, the density of suppressor polymers in the bottom of the large depth-to-width aspect ratio feature 110 is lower than the top. But the same phenomenon may not be apparently observed on the small depth-to-width aspect ratio feature 108.

Figure 9:
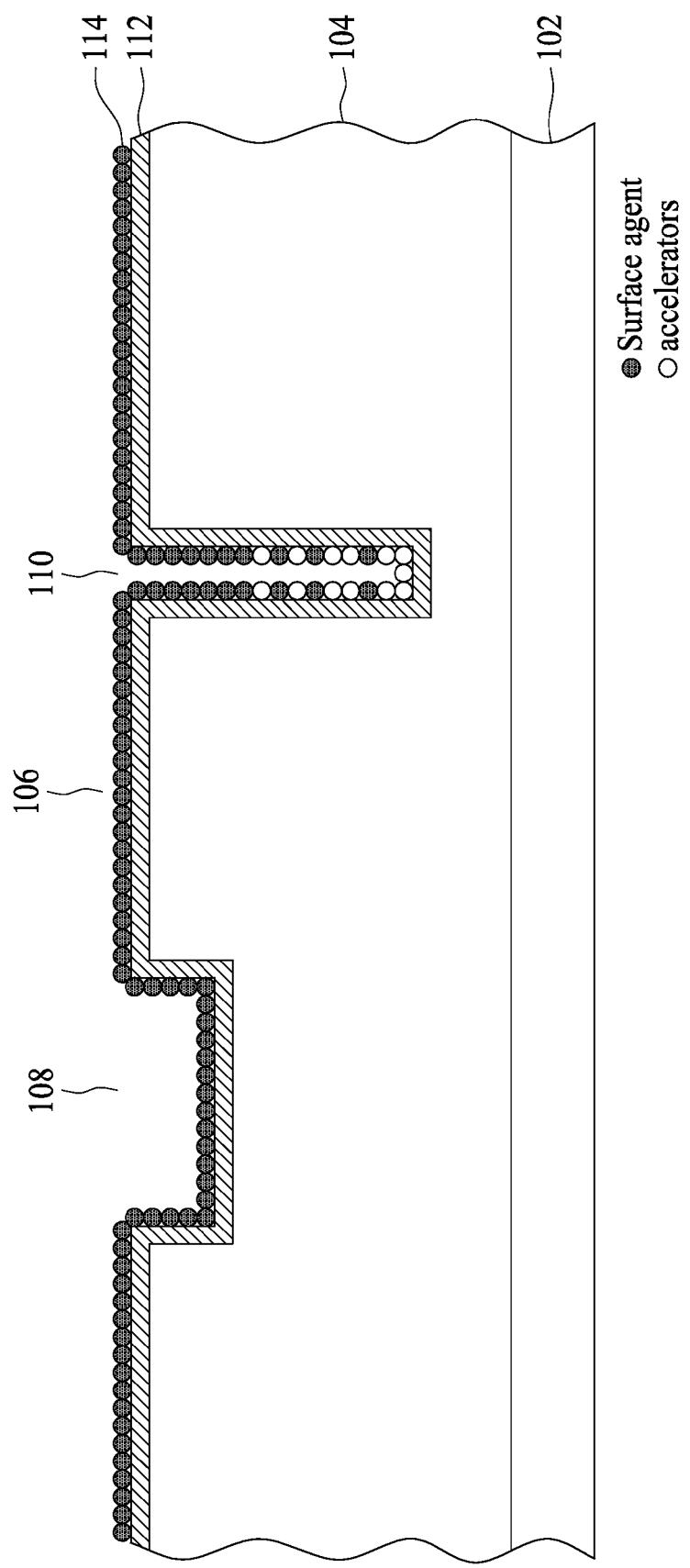
FIG. 9 is a diagram illustrating a cross-sectional view of a patterned multilayer wafer covered by a surface agent and accelerators.

Since the large depth-to-width aspect ratio feature 110 is almost covered by the thin suppressor polymer layer 114, except the surfaces around the bottom, the subsequent accelerators may preferentially contact with surfaces around the bottom of the large depth-to-width aspect ratio feature 110 as shown in FIG. 9. FIG. 9 is a diagram illustrating a cross-sectional view of the patterned multilayer wafer 100 covered by the surface agent and the accelerators. The electroplating may preferentially take place from the bottom of the recess 100 and effectively reduce the chance of sealing the top of the large depth-to-width aspect ratio feature 110 before completely filling with a desired metal. The present disclosure takes advantages of this non-uniform suppressor distribution which is pre-applied for the following electroplating operations.

Figure 10:
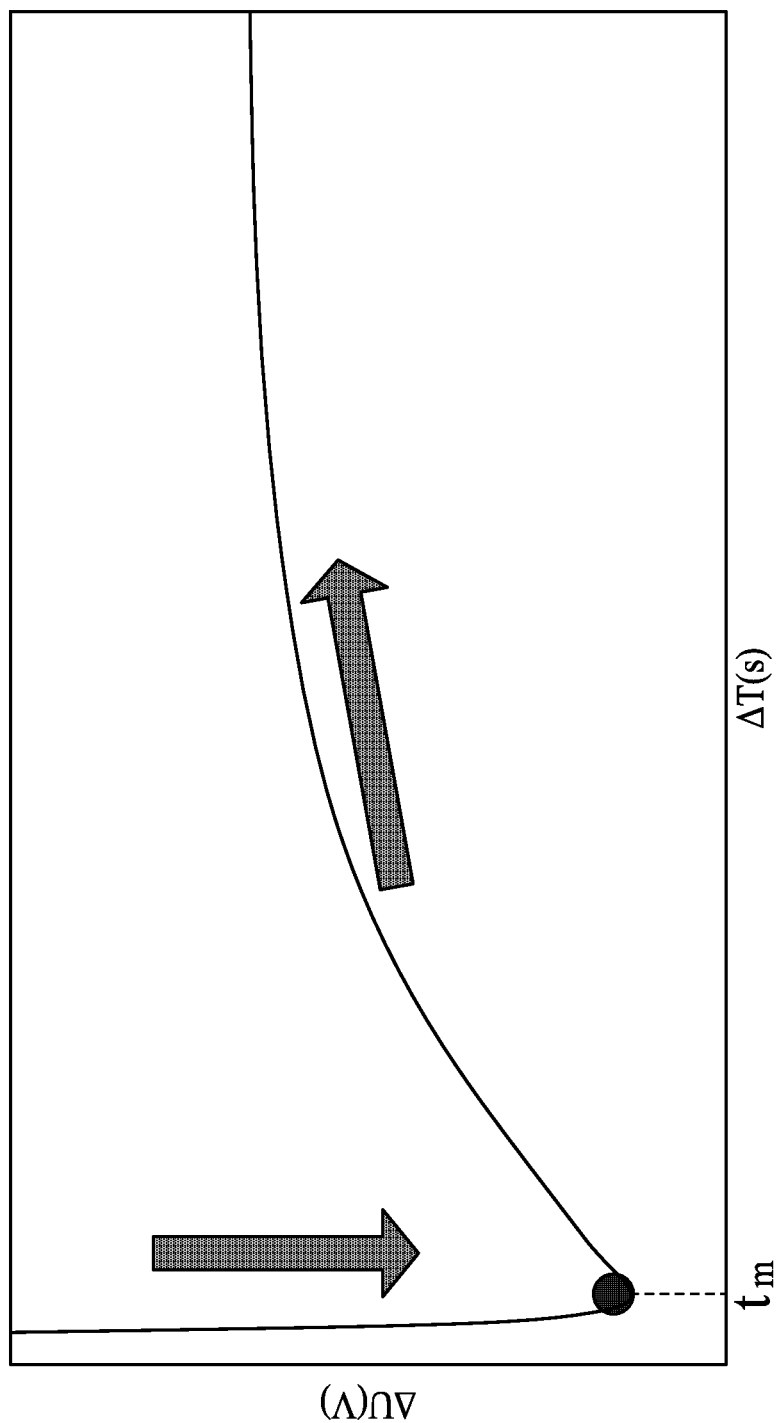
FIG. 10 is an electrochemical transient diagram illustrating suppresser/accelerator interaction upon a patterned multilayer wafer with a thin polymer layer.

FIG. 10 is an electrochemical transient diagram illustrating suppresser/accelerator interaction upon the patterned multilayer wafer 100 with the thin polymer layer 114 applied on the multilayer wafer 100. A Y axis of the diagram is representative of measured electrical potential on the seed layer 112, denoted as $\Delta U(V)$; an X axis of the diagram is representative of time denoted as $\Delta T(s)$. At a first phase before time $t_m$, it can be seen that due to the pretreatment operation that applies the thin polymer layer 114 onto the seed layer 112 as an insulator, the curve of FIG. 10 reaches to its lowest point rapidly at time $t_m$, which is much earlier than time $t_M$ shown in FIG. 2. The lowest point of the measured electrical potential curve indicates the suppressor reaction has been completed. As the suppressor reaction can be performed rapidly, the possibility of voids or seams occurring can be greatly reduced. In other words, the fast reaction ability of suppressors can protect the top of the large depth-to-width aspect ratio feature from being sealed before the suppressor is fully reacted.

The pretreatment operation of step 306 is followed by an ion electroplating operation as shown in step 308 and step 310. In step 308, the wafer 500 is immersed into an electroplating solution including metallic ions. In step 310, a bias is applied to the conductive seed layer 112 in order to fill metallic material in the recessed features. Steps 308 and 310 together may be an ion electroplating operation including several operating phases, such as an entry phase, an initial phase and a bottom-up filling phase. Steps 308 and 310 may also include alternate techniques. It will depend on practical process considerations or the type of metal desired for plating. The electroplating solution may include metallic ions and several additives, such as a suppressor additive, an accelerator additive and a leveler additive as mentioned. In some embodiments, the electroplating solution may not include the leveler additive. In some embodiments, the electroplating solution may not include the suppressor additive. Please note that an average diameter or molecular weight of the suppressor polymer employed in step 304, such as PEG, PPG or PEO, is much greater than the accelerator additive. For example, the average molecular weight of the suppressor polymer of the surface agent is about 1000 times to about 10000 times greater than the accelerator additive. However, this is not a limitation of the present disclosure.

Figure 11:
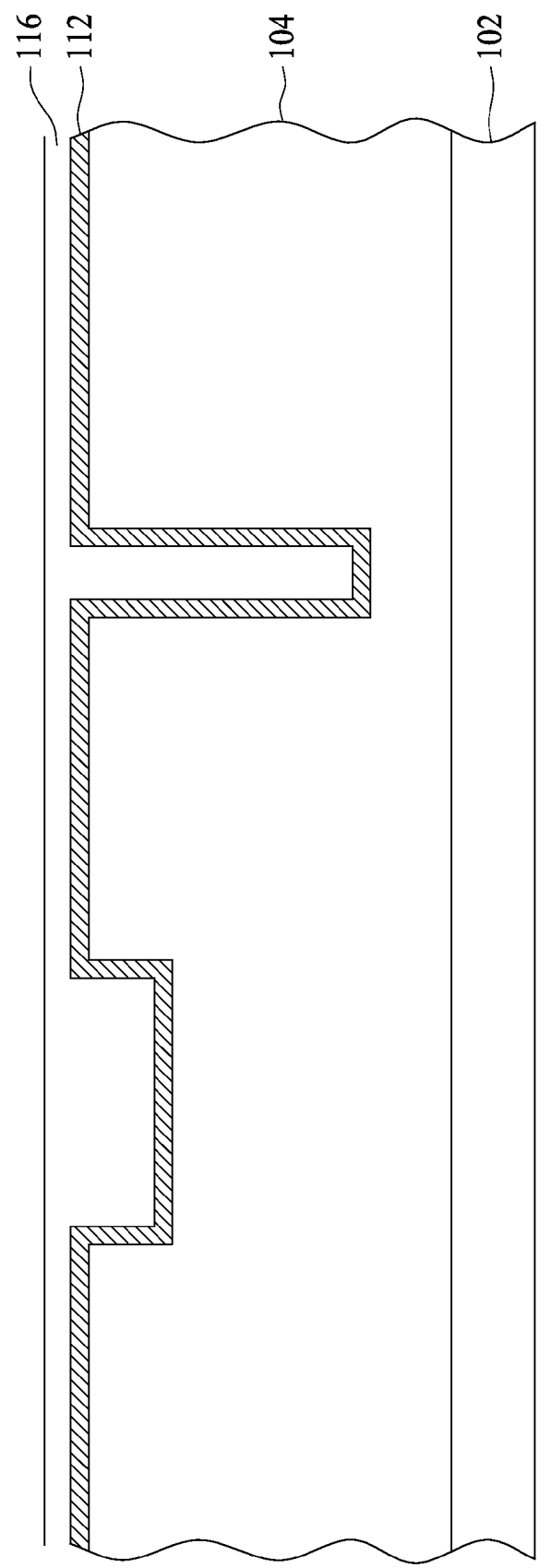
FIG. 11 is diagram illustrating a cross-sectional view of a patterned multilayer wafer electroplated without void.

The accelerators gradually pass through the polymer film 114 and adhere to the metal seed layer 112. The measured electrical potential starts rising at a second phase after time $t_m$ as shown in FIG. 10. In other words, the polymer film 114 is gradually deactivated by accelerators. Locations near the bottom surfaces of the recesses have a lower deactivation time as compared with locations near the top surfaces of the recesses as a result of a lower density at the bottom of the polymer film 114. Therefore, the metal plating preferentially takes place around the bottom of the polymer film 114 and slowly grows up along with the high density suppressors adhering to the top of the polymer film 114, wherein the high density suppressors are gradually deactivated. Thus, the wafer electroplated by a metal material layer 116 can be obtained in the end of the electroplating operation as shown in FIG. 11. In brief, the bottom-up operation is enhanced by the pretreatment before the electroplating operation so that the possibility of voids or seams occurring is greatly reduced.

Some embodiments of the present disclosure provide a method of manufacturing a semiconductor device. The method includes providing a substrate with a dielectric disposed thereon, wherein the dielectric has a recess formed by a plurality of exposed surfaces; forming a conductive film on the plurality of exposed surfaces; applying a surface agent to the recess so that the surface agent adheres to a portion of the conductive film; immersing the substrate into an electroplating solution including metallic ions; and applying a bias to the conductive film in order to fill metallic material in the recess.

In some embodiments of the present disclosure, the surface agent includes a hydrophilic polymer.

In some embodiments of the present disclosure, the surface agent includes polyethylene glycol.

In some embodiments of the present disclosure, the surface agent includes polypropylene glycol.

In some embodiments of the present disclosure, the surface agent includes polyethylene oxide.

In some embodiments of the present disclosure, the metallic material is filled in the recess using a bottom-up operation.

In some embodiments of the present disclosure, the surface agent is applied to the recess through spin coating.

In some embodiments of the present disclosure, the surface agent is applied to the recess through wetting.

In some embodiments of the present disclosure, the surface agent is applied to the recess through spray coating.

In some embodiments of the present disclosure, the surface agent is applied to the recess through vapor coating.

In some embodiments of the present disclosure, the electroplating solution further includes a suppressor additive.

In some embodiments of the present disclosure, the electroplating solution further includes an accelerator additive.

In some embodiments of the present disclosure, an average molecular weight of the surface agent is about 1000 times to about 10000 times greater than the accelerator additive.

In some embodiments of the present disclosure, the electroplating solution further includes a leveler additive.

Some embodiments of the present disclosure provide a method of manufacturing a semiconductor device. The method includes providing a substrate with a conductive film disposed thereon, wherein the substrate has a plurality of recesses, and each of the recesses has a depth-to-width aspect ratio; applying a surface agent to the recesses; immersing the substrate into an electroplating solution including metallic ions; and applying a bias to the conductive film in order to fill metallic material in the recesses, wherein each of the recesses has a bottom density of the surface agent dependent on the depth-to-width aspect ratio.

In some embodiments of the present disclosure, the bottom density of the surface agent decreases as the depth-to-width aspect ratio increases.

In some embodiments of the present disclosure, the surface agent includes polyethylene glycol, polypropylene glycol or polyethylene oxide.

In some embodiments of the present disclosure, the surface agent is applied to the recesses through spin coating, immersing, spray coating or vapor coating.

Some embodiments of the present disclosure provide a method of manufacturing a semiconductor device. The method includes providing a substrate with a conductive film disposed thereon; and applying a surface agent to the conductive film; wherein the substrate includes a plurality of recesses having a range of depth-to-width aspect ratios, and a lowest density of the surface agent adhering to the conductive film occurs preferentially on bottom surfaces of the recesses having the largest depth-to-width aspect ratio.

In some embodiments of the present disclosure, the surface agent includes polyethylene glycol.

What is claimed is:

1. A method of manufacturing a semiconductor device, the method comprising: providing a substrate with a dielectric disposed thereon, wherein the dielectric has a recess formed by a plurality of exposed surfaces; forming a conductive film on the plurality of exposed surfaces; applying a surface agent consisting essentially of a suppressor to the recess so that the surface agent adheres to a portion of the conductive film; after applying the surface agent to the recess, immersing the substrate into an electroplating solution comprising metallic ions and accelerator additive; and applying an electrical bias to the conductive film in order to fill metallic material in the recess; wherein the surface agent does not include the metallic ions, and the surface agent substantially retards the metallic ions being attached onto the conducting film when filling the metallic material in the recess.

2. The method of claim 1, wherein the surface agent comprises a hydrophilic polymer.

3. The method of claim 2, wherein the surface agent comprises polyethylene glycol.

4. The method of claim 2, wherein the surface agent comprises polypropylene glycol.

5. The method of claim 2, wherein the surface agent comprises polyethylene oxide.

6. The method of claim 1, wherein the metallic material is filled in the recess using a bottom-up operation.

7. The method of claim 1, wherein the surface agent is applied to the recess through spin coating.

8. The method of claim 1, wherein the surface agent is applied to the recess through wetting.

9. The method of claim 1, wherein the surface agent is applied to the recess through spray coating.

10. The method of claim 1, wherein the surface agent is applied to the recess through vapor coating.

11. The method of claim 1, wherein the electroplating solution further comprises a suppressor additive.

12. The method of claim 1, wherein the electroplating solution further comprises an accelerator additive.

13. The method of claim 12, wherein an average molecular weight of the surface agent is about 1000 times to about 10000 times greater than the accelerator additive.

14. The method of claim 1, wherein the electroplating solution further comprises a leveler additive.

15. A method of manufacturing a semiconductor device, the method comprising: providing a substrate with a conductive film disposed thereon, wherein the substrate has a plurality of recesses, and each of the recesses has a depth-to-width aspect ratio; applying a surface agent consisting essentially of a suppressor to the recesses; after applying the surface agent to the recesses, immersing the substrate into an electroplating solution comprising metallic ions; and applying an electrical bias to the conductive film in order to fill metallic material in the recesses, wherein each of the recesses has a bottom density of the surface agent dependent on the depth-to-width aspect ratio; wherein the surface agent does not include the metallic ions, and the surface agent substantially retards the metallic ions being attached onto the conducting film when filling the metallic material in the recess.

16. The method of claim 15, wherein the bottom density of the surface agent decreases as the depth-to-width aspect ratio increases.

17. The method of claim 15, wherein the surface agent comprises polyethylene glycol, polypropylene glycol or polyethylene oxide.

18. The method of claim 15, wherein the surface agent is applied to the recesses through spin coating, immersing, spraying or vapor coating.

19. A method of manufacturing a semiconductor device, the method comprising: providing a substrate with a conductive film disposed thereon; and applying a surface agent consisting essentially of a suppressor to the conductive film; wherein the substrate comprises a plurality of recesses having a range of depth-to-width aspect ratios, and a low density of the surface agent adhering to the conductive film occurs preferentially on bottom surfaces of the recesses having a large depth-to-width aspect ratio; and wherein the surface agent does not include metallic ions, and the surface agent substantially retards the metallic ions being attached onto the conducting film.

20. The method of claim 19, wherein the surface agent comprises polyethylene glycol.

* * * * *